United States Patent [19]

Dey

[11] Patent Number: 5,255,244
[45] Date of Patent: Oct. 19, 1993

[54] METHOD AND APPARATUS FOR SERIALLY PROGRAMMING AN ON-CHIP EPROM IN A MICROCONTROLLER

[75] Inventor: Shankar Dey, San Jose, Calif.

[73] Assignee: National Semiconductor Corporation, Santa Clara, Calif.

[21] Appl. No.: 718,589

[22] Filed: Jun. 21, 1991

[51] Int. Cl.[5] .................................................. G11C 13/00
[52] U.S. Cl. ................................. 365/233; 365/189.03
[58] Field of Search ..................... 365/189.01, 189.03, 365/189.04, 233, 230.06

[56] References Cited

U.S. PATENT DOCUMENTS 5,079,742 1/1992 Simpson ............................... 365/233

*Primary Examiner*—Terrell W. Fears
*Attorney, Agent, or Firm*—Michael J. Pollock

[57] ABSTRACT

Apparatus for serially programming a microcontroller's on-chip EPROM includes mode decode logic that responds to operating mode input signals by generating corresponding operating mode signals, including an EPROM mode signal. An upper byte address shift register serially receives a most significant address portion of an EPROM address in response to a shift clock signal and provides the most significant address portion as an upper byte parallel output. A lower byte address shift register serially receives a least significant address portion of the EPROM address in response to the shift clock and provides the least significant address portion as a lower byte parallel output. A memory address register loads the upper and lower byte parallel outputs from the upper and lower byte address shift registers, respectively, and provides an EPROM address output in response to a load signal. An EPROM memory element responds to the EPROM address by providing access to a storage element specified by the EPROM address.

5 Claims, 2 Drawing Sheets

METHOD AND APPARATUS FOR SERIALLY PROGRAMMING AN ON-CHIP EPROM IN A MICROCONTROLLER

BACKGROUND OF THE INVENTION

1. Field of the Invention

The present invention relates generally to microcontrollers and, in particular, to a simple, cost-effective controller architecture for the reliable, serial mode programming of an on-chip EPROM utilizing minimal resources.

2. Discussion of the Prior Art

Microcontroller devices typically include an on-chip non-volatile memory element which stores application software. If this memory is ROM, then the application program is fabricated into the device during manufacturing and can never be changed. This one time programming problem is solved by making the ROM electrically programmable (EPROM).

A microcontroller with on-chip EPROM usually has a number of distinct operating modes, typically including at least one programming mode for loading application data into the EPROM and for reading the EPROM contents. The microcontroller operating modes, of course, include a normal run mode which is utilized when the EPROM has been programmed and the device is performing its intended function of executing its application code.

In the EPROM programming mode, the microcontroller is configured to emulate a stand-alone EPROM memory device. In this way, the programming of microcontrollers can be accomplished using well accepted and well understood methods and equipment for programming EPROMs. This is done by allowing the microcontroller EPROM to be programmed by an external programming system.

However, to program an EPROM, the programming hardware must have access to it. The details of this access and its execution depends upon how the microcontroller logic provides a programming interface between the external programming system and the internal on-chip EPROM. In the past, this interface has always used a parallel data-flow architecture, which is silicon intensive.

SUMMARY OF THE INVENTION

The present invention provides a serial dataflow interface for programming the on-chip EPROM of a serial architecture microcontroller integrated circuit. The invention provides architectural consistency between programming the EPROM and normal operation of the microcontroller. It also saves silicon real estate by harnessing the benefits of a serial data flow interface.

The controller architecture includes mode decode logic that generates one of a plurality of controller operating mode signals based on a multi-bit input. One of the operating modes is an EPROM programming mode. External programming hardware provides both an EPROM load clock signal and an EPROM phi clock signal. An upper byte address shift register serially receives a most significant address portion of an EPROM address in response to a pphi clock input and provides the most significant address portion as an upper byte parallel output. Similarly, a lower byte address shift register serially receives a least significant address portion of an EPROM address in response to the pphi clock input and provides the least significant address portion as a lower byte parallel output. A memory address register loads both the upper and lower byte parallel outputs from the upper byte and lower byte addressed shift registers, respectively, and provides the EPROM address as an output in response to an EPROM pload signal. Thus, the output of the memory address register includes both the most significant address portion and the least significant address portion. An EPROM memory element that comprises a plurality of storage elements and address decoder logic responds to the EPROM address provided by the memory address register by providing access to a storage element specified by the EPROM address.

The microcontroller further includes a data out register that receives a parallel output of the contents of the data storage register specified by the EPROM address and provides the contents as a serial output signal in response to the pphi clock signal. The microcontroller also includes a data in register that receives a serial input signal in response to the pphi clock signal and loads its contents in parallel to the storage location specified by the EPROM address in response to NWR signal in the programming mode.

The microcontroller also includes the appropriate multiplexing capability to load the upper byte and lower byte address shift registers either from internal sources or, when the EPROM mode signal is active, serially from an external source.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
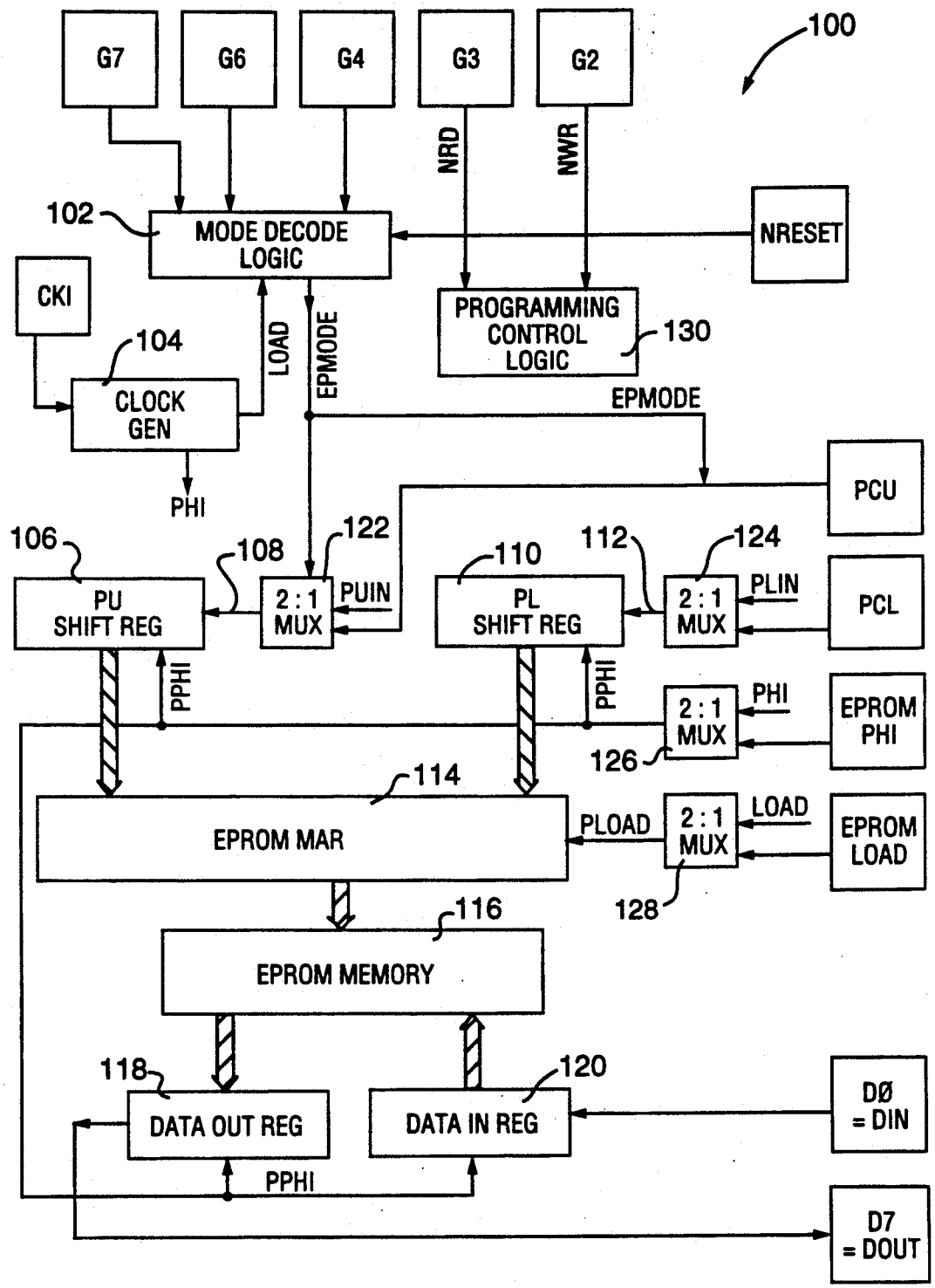
FIG. 1 is a block diagram illustrating a microcontroller EPROM programming architecture in accordance with the present invention.

FIG. 1 shows a microcontroller architecture 100 that includes mode decode logic 102. The mode decode logic 102 responds to a three-bit input G7, G6, G4 to generate one of a plurality of operating mode output signals. In the illustrated embodiment, the value of the input G7, G6, G4 is such that the mode decode logic 102 generates an EPROM programming mode signal EPMODE. The mode decode logic 102 also receives a reset input and a LOAD clock input for resetting the logic 102 for selection of an alternative operating mode.

The microcontroller architecture 100 also includes a clock generator 104 that receives a system clock input CKI and provides a phi clock output signal and a divide-by-10 LOAD clock signal.

The microcontroller architecture 100 also includes programming control logic 130 that responds to a read input signal NRD provided at the G3 input pin by enabling the contents of the storage locations specified by the EPROM address to be read from the storage location. A write enable signal NWR provided at input pin G2 enables the contents of the specified storage register to be written from the data in register 120 when NRESET=VPP.

An upper byte address shift register 106 receives a serial bit stream 108 that loads a most significant address portion of an EPROM address in response to an internal shift clock signal, designated "pphi" in FIG. 1. The 8-bit parallel output of the upper byte address shift register 106 provides the eight most significant bits of the EPROM address to memory address register 114.

Similarly, a lower byte address shift register 110 receives a serial bit stream 112 that loads an 8-bit least significant address portion of the EPROM address into the upper byte address shift register 110 in response to the pphi clock input signal. The lower byte address shift register 110 provides a parallel output of the eight least significant bits of the EPROM address to memory address register 114.

A memory address register 114 loads the upper and lower 8-bit parallel outputs from the upper byte register 106 and lower byte register 110, respectively, and provides a 16-bit EPROM address as its output in response to an EPROM load signal PLOAD.

A conventional EPROM memory array 116 that includes a plurality of storage registers and decoder circuitry responsive to the EPROM address provided by the memory address register 114 provides access to a storage register specified by the EPROM address.

The microcontroller architecture 100 also includes a data-out register 118 that receives a parallel output of the contents of the storage register specified by the EPROM address in response to the NRD clock input. The contents of the data-out register 118 are provided as a serial output to a data-out pin D7 in response to the pphi clock signal.

The microcontroller 100 also includes a data in register 120 that receives a serial input signal from a data in pin D0 in response to the pphi clock signal. The data in register 120 loads its contents in parallel to the storage location specified by the EPROM address in response to the NWR clock input and NRESET=VPP.

As further shown in FIG. 1, the microcontroller architecture includes four multiplexers that enable the EPROM to be programmed from an external source in the EPROM programming mode, i.e., when the EPROM programming mode signal EPMODE is active.

An upper byte multiplexer 122 selects between either an internal upper byte serial bit stream PUIN in a non-EPROM mode or an upper byte serial bit stream provided via an upper byte address input pin PCU in EPROM mode. Selection of the bit stream from input pin PCU occurs when the EPROM programming mode EPMODE is active.

Similarly, a lower byte multiplexer 124 selects from either an internally generated lower byte bit stream PLIN or an externally-supplied serial bit stream received via lower byte address input pin PCL.

A phi clock multiplexer 126 selects between the phi clock received from the clock generator 104 or a shift clock input signal EPROM phi when the EPROM programming mode signal EPMODE is active. The output of the phi clock multiplexer 126 is the internal shift clock signal pphi. A load clock multiplexer 128 selects between the load clock provided by the clock generator 104 and a program cycle clock input EPROM load when the EPMODE signal is active.

The operation of the microcontroller architecture described above will now be discussed.

Figure 2:
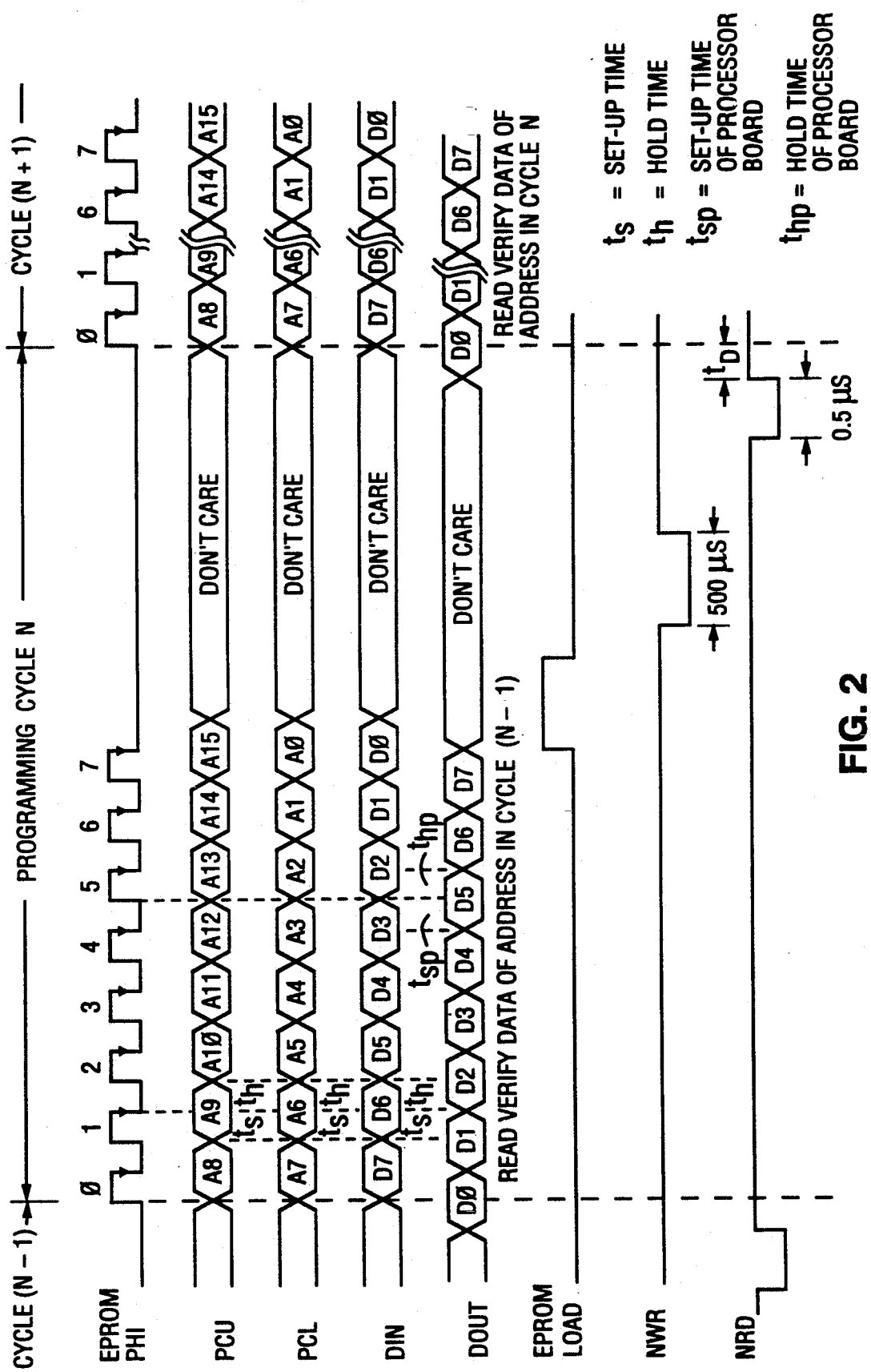
FIG. 2 is a timing diagram illustrating the waveforms of the various signals utilized in the operation of the FIG. 1 microcontroller architecture.

Referring to FIG. 2, in each programming cycle of the microcontroller 100, there are eight shift clocks. Eight bits of lower byte address are provided serially through the PCL input pin and are latched inside the lower byte shift register 110 from the falling edge of the shift clocks. There is a set up time $T_S$ and a hold time $T_H$ as shown in the FIG. 2 timing diagram for this latch-up action.

Similarly, 8 bits of upper byte of address are received through the PCU input pin and are latched into the upper byte shift register 106. Likewise, eight bits of data byte are received through the DIN pin and are latched into the data in shift register 120. The programming clock NWR parallel transfers these 8 bits of data into the address provided by the address register 114. When a read pulse is received, the data is read in parallel into the data out register 118. Then, a new cycle starts and a new shift clock is received and serially outputs the read verify data through the D OUT pin D7. Thus, there is a pipeline between data in and data out. As further shown in FIG. 2, in programming cycle N, the D OUT pin outputs read verify data of program cycle N−1. This pipeline speeds up the programming time.

Since the verification of programming is happening one cycle later, and if the programmer does not want to move to a new address until the current one is verified, it can either send the same address again or simply kill the load pulse for one cycle.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A microcontroller architecture for serially programming the microcontrollers on-chip EPROM, the microcontroller architecture comprising
    a) mode decode means responsive to a plurality of operating mode input signals for generating corresponding operating mode signals, including an EPROM mode signal;
    b) a clock generator for generating a load clock signal;
    c) an upper byte address shift register for serially receiving a most significant address portion of an EPROM address in response to a pphi clock input signal and for providing the most significant address portion as an upper byte parallel output;
    d) a lower byte address shift register for serially receiving a least significant address portion of an EPROM address in response to the pphi clock input signal and for providing the least significant address portion as a lower byte parallel output;
    e) a memory address register that loads the upper and lower byte parallel outputs from the upper and lower byte address shift registers, respectively, and provides an EPROM address as an output, the EPROM address including the most and least significant address portions, in response to an EPROM load signal; and
    f) an EPROM memory element comprising a plurality of storage elements and decoder means responsive to the EPROM address provided by the memory address register for providing access to a storage element specified by the EPROM address.

2. A microcontroller as in claim 1 and further including a data out register that receives a parallel output of the contents of the storage register specified by the EPROM address in response to a read clock signal and provides the contents as a serial output signal to a data out pin in response in the phi clock signal.

3. A microcontroller as in claim 2 and further including a data in register that receives a serial input signal from a data in pin in response to the pphi clock and loads its contents in parallel to the storage location specified by the EPROM address in response to a write signal and NRESET=VPP.

4. A microcontroller as in claim 1 and further including;
 a) an upper byte multiplexer that selects one of a plurality of upper byte address input signals as the most significant address portion in response to a corresponding select input signal, the address input signals including an externally-supplied upper byte signal, the externally-supplied upper byte signal being the selected upper address input signal when the select signal is the EPROM mode signal;
 b) a lower byte multiplexer that selects one of a plurality of lower address input signals as the least significant address portion in response to a corresponding select input signal, the lower address input signals including an externally-supplied lower byte signal, the externally-supplied lower byte signal being the selected lower address input signal when the select input signal is the EPROM mode signal;
 c) a clock multiplexer that selects one of a plurality of clock input signals as the shift clock signal in response to a corresponding select input signal, the clock input signals including an externally-supplied EPROM clock signal, the EPROM clock signal being the selected clock signal when the select signal is the EPROM mode signal; and
 d) a load clock multiplexer that selects one of a plurality of load clock signals as the pload clock signal in response to a corresponding select input signal, the load clock signals including an externally-supplied EPROM load clock signal, the EPROM load clock signal being the selected load clock signal when the select signal is the EPROM mode signal.

5. A microcontroller as in claim 1 and further comprising programming control logic responsive to a read input signal for enabling the contents of the storage location specified by the EPROM address to be read from the storage location and responsive to a write input signal for enabling the contents of the storage register specified by the EPROM address to be written.

* * * * *

UNITED STATES PATENT AND TRADEMARK OFFICE
CERTIFICATE OF CORRECTION

PATENT NO. : 5,255,244
DATED : OCTOBER 19, 1993
INVENTOR(S) : SHANKAR DEY

It is certified that error appears in the above-identified patent and that said Letters Patent is hereby corrected as shown below:

In Col. 4, line 47, delete "pphi" and replace with --shift--.

In Col. 4, line 52, delete "pphi" and replace with --shift--.

In Col. 5, line 4, delete "phi" and replace with --shift--.

In Col. 5, line 7, delete "pphi" and replace with --shift--.

Signed and Sealed this

Fifth Day of April, 1994

Attest:

BRUCE LEHMAN

*Attesting Officer*  *Commissioner of Patents and Trademarks*